(12) United States Patent
Jacob et al.

(10) Patent No.: US 9,564,367 B2
(45) Date of Patent: Feb. 7, 2017

(54) METHODS OF FORMING DIFFERENT FINFET DEVICES WITH DIFFERENT THRESHOLD VOLTAGES AND INTEGRATED CIRCUIT PRODUCTS CONTAINING SUCH DEVICES

(75) Inventors: Ajey P. Jacob, Albany, NY (US); Witold P. Maszara, Morgan Hill, CA (US); Kerem Akarvardar, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 572 days.

(21) Appl. No.: 13/613,508

(22) Filed: Sep. 13, 2012

(65) Prior Publication Data

US 2014/0070322 A1  Mar. 13, 2014

(51) Int. Cl.
| | |
|---|---|
| *H01L 21/8234* | (2006.01) |
| *H01L 21/8252* | (2006.01) |
| *H01L 21/8258* | (2006.01) |
| *H01L 27/088* | (2006.01) |
| *H01L 29/66* | (2006.01) |
| *H01L 29/78* | (2006.01) |
| *H01L 29/10* | (2006.01) |

(52) U.S. Cl.
CPC ... *H01L 21/823431* (2013.01); *H01L 21/8252* (2013.01); *H01L 21/8258* (2013.01); *H01L 27/0886* (2013.01); *H01L 29/1054* (2013.01); *H01L 29/66795* (2013.01); *H01L 29/785* (2013.01)

(58) Field of Classification Search
CPC ............... H01L 21/823431; H01L 21/8252; H01L 21/8258; H01L 27/0886; H01L 29/1054; H01L 29/66795; H01L 29/785

USPC ........ 257/314, 369, 401, 347, 327; 438/157, 438/199

See application file for complete search history.

(56) References Cited

U.S. PATENT DOCUMENTS

| | | | |
|---|---|---|---|
| 6,936,882 B1 * | 8/2005 | Ahmed et al. | 257/314 |
| 7,198,995 B2 * | 4/2007 | Chidambarrao et al. | 438/157 |
| 7,265,059 B2 | 9/2007 | Rao et al. | |
| 7,655,989 B2 * | 2/2010 | Zhu et al. | 257/401 |
| 7,851,340 B2 | 12/2010 | Brownson et al. | |
| 7,960,791 B2 | 6/2011 | Anderson et al. | |
| 7,993,999 B2 * | 8/2011 | Basker et al. | 438/199 |
| 8,264,032 B2 * | 9/2012 | Yeh et al. | 257/327 |
| 8,481,410 B1 * | 7/2013 | Licausi | H01L 21/823821 257/253 |
| 8,969,974 B2 * | 3/2015 | Liaw | H01L 21/823821 257/401 |
| 9,054,212 B2 * | 6/2015 | Juengling | H01L 21/823431 |
| 9,196,543 B2 * | 11/2015 | Liaw | H01L 21/823821 |
| 9,287,402 B2 * | 3/2016 | Oh | H01L 29/66477 |

(Continued)

*Primary Examiner* — Brett Feeney
*Assistant Examiner* — Sophia Nguyen
(74) *Attorney, Agent, or Firm* — Amerson Law Firm, PLLC

(57) ABSTRACT

One illustrative method disclosed herein involves forming a first fin for a first FinFET device in and above a semiconducting substrate, wherein the first fin is comprised of a first semiconductor material that is different from the material of the semiconducting substrate and, after forming the first fin, forming a second fin for a second FinFET device that is formed in and above the semiconducting substrate, wherein the second fin is comprised of a second semiconductor material that is different from the material of the semiconducting substrate and different from the first semiconductor material.

14 Claims, 12 Drawing Sheets

(56) References Cited

U.S. PATENT DOCUMENTS

| | | | |
|---|---|---|---|
| 9,337,050 B1* | 5/2016 | Xie | H01L 21/3086 |
| 9,362,179 B1* | 6/2016 | Cheng | H01L 21/823821 |
| 2005/0130358 A1* | 6/2005 | Chidambarrao | H01L 21/823807 438/197 |
| 2009/0242964 A1* | 10/2009 | Akil | H01L 21/28282 257/324 |
| 2011/0121406 A1* | 5/2011 | Lee et al. | 257/401 |
| 2011/0223736 A1* | 9/2011 | Lin | H01L 21/823821 438/305 |
| 2012/0025313 A1 | 2/2012 | Chang et al. | |
| 2012/0319211 A1* | 12/2012 | van Dal | H01L 29/66795 257/401 |
| 2013/0069167 A1* | 3/2013 | Zhu et al. | 257/369 |
| 2013/0105894 A1* | 5/2013 | Brodsky et al. | 257/347 |
| 2013/0113042 A1* | 5/2013 | Wang et al. | 257/347 |
| 2013/0244392 A1* | 9/2013 | Oh | H01L 29/66477 438/299 |
| 2013/0270641 A1* | 10/2013 | Chi | H01L 21/823821 257/351 |
| 2013/0334614 A1* | 12/2013 | Liaw | H01L 21/823821 257/401 |
| 2014/0015015 A1* | 1/2014 | Krivokapic | H01L 21/02527 257/288 |
| 2014/0027860 A1* | 1/2014 | Glass | H01L 21/823807 257/401 |
| 2014/0175543 A1* | 6/2014 | Glass | H01L 21/823431 257/337 |
| 2014/0346607 A1* | 11/2014 | Ching | H01L 29/66795 257/369 |
| 2015/0214365 A1* | 7/2015 | Xie | H01L 29/7842 257/369 |
| 2015/0228503 A1* | 8/2015 | Zhang | H01L 21/3065 438/585 |
| 2015/0235905 A1* | 8/2015 | Liaw | H01L 21/823481 438/283 |
| 2015/0279970 A1* | 10/2015 | Zhang | H01L 29/66795 438/157 |
| 2016/0056271 A1* | 2/2016 | Liaw | H01L 29/7853 438/591 |
| 2016/0133522 A1* | 5/2016 | Kang | H01L 21/823431 438/283 |
| 2016/0133528 A1* | 5/2016 | Cheng | H01L 21/845 257/351 |
| 2016/0155804 A1* | 6/2016 | Oh | H01L 29/66477 257/369 |

* cited by examiner

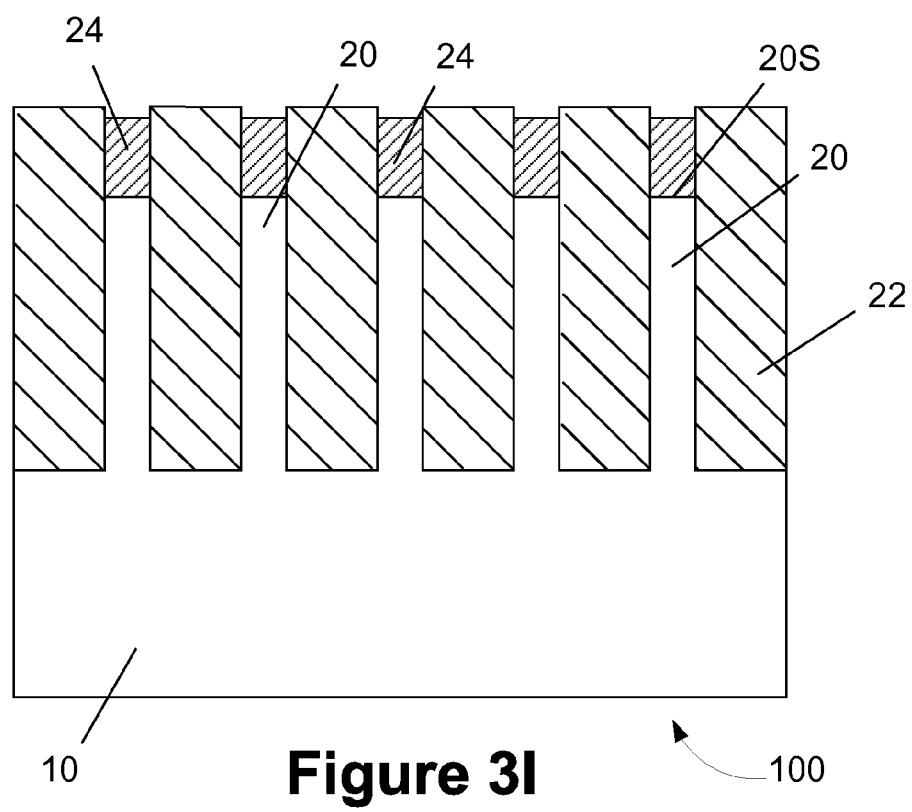

METHODS OF FORMING DIFFERENT FINFET DEVICES WITH DIFFERENT THRESHOLD VOLTAGES AND INTEGRATED CIRCUIT PRODUCTS CONTAINING SUCH DEVICES

BACKGROUND OF THE INVENTION

1. Field of the Invention

Generally, the present disclosure relates to the manufacture of sophisticated semiconductor devices, and, more specifically, to various methods of forming different FinFET devices with different threshold voltages by varying the materials of construction for the fins of such devices, and to integrated circuit products that contain such FinFET devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded. Due to rapid advances in technology of the past several years, the channel length of FET devices has become very small, e.g., 20 nm or less, and further reduction in the channel length is desired and perhaps anticipated, e.g., channel lengths of approximately 10 nm or less are anticipated in future device generations.

In contrast to a FET, which has a planar structure, there are so-called 3D devices, such as an illustrative FinFET device, which is a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

With respect to either a FET or a FinFET, threshold voltage is an important characteristic of a transistor. Simplistically, a transistor can be viewed as a simple ON-OFF switch. The threshold voltage of a transistor is the voltage level above which the transistor is turned "ON" and becomes conductive. That is, if the voltage applied to the gate electrode of the transistor is less than the threshold voltage of the transistor, then there is no current flow through the channel region of the device (ignoring undesirable leakage currents, which are relatively small). However, when the voltage applied to the gate electrode exceeds the threshold voltage, the channel region becomes conductive, and electrical current is permitted to flow between the source region and the drain region through the conductive channel region.

There are many situations where it would be desirable to have the ability to produce transistor devices with different threshold voltages. Some of these approaches are (1) well doping; (2) gate length modulation; (3) multiple gate work function metal electrodes; (4) Fin width modulation; and (5) back gate as in Extremely Thin Silicon on Insulator structures (ETSOI). The capability of producing integrated circuit products with transistors that have differing threshold voltages will provide circuit designers with increased flexibility in designing increasingly complex integrated circuit products.

Various techniques have been employed in attempts to vary or control the threshold voltages of transistor devices. One technique involves introducing different dopant levels into the channel regions of different transistors in an effort to produce devices having different threshold voltages. However, given the very small channel length on current and future device generations, e.g., 10 nm gate length, it is very difficult to uniformly dope such a small area of the substrate due to inherent variations in the ion implanting process that are typically performed to introduce such dopant materials. As a result of lack of uniformity in the channel doping, this technique has resulted in devices having reduced performance capability and/or undesirable or unacceptable variations in the threshold voltage of such devices as compared to desired or target threshold voltages of such devices.

Another technique for manufacturing devices having different threshold voltage levels involves including so-called work function adjusting metals, such as lanthanum, aluminum and the like, as part of the gate structures of various devices, i.e., N-channel transistors and P-channel transistors, respectively. However, as the gate length of the transistors has decreased, it has become increasingly more challenging to effectively and efficiently incorporate such additional materials into the gate structure. Even if there is sufficient room for such additional work function adjusting materials, the fabrication of such devices is extremely complex and time consuming.

The present disclosure is directed to various methods of forming FinFET devices that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming different FinFET devices with different threshold voltages by varying the materials of construction for the fins of such devices, and to integrated circuit products that contain such FinFET devices. One illustrative method disclosed herein involves forming a first fin for a first FinFET device in and above a semiconducting substrate, wherein the first fin is comprised of a first semiconductor material that is different from the material of the semiconducting substrate and after forming the first fin, forming a second fin for a second FinFET device that is formed in and above the semiconducting substrate, wherein the second fin is comprised of a second semiconductor material that is different from the material of the semiconducting substrate and different from the first semiconducting material.

Another illustrative method disclosed herein involves forming a first patterned mask layer above a semiconducting substrate, wherein the first patterned mask layer exposes a first region of the substrate where a first FinFET device will be formed, performing at least one process operation through the first patterned mask layer to form a first fin for the first FinFET device, wherein the first fin is comprised of a first semiconductor material that is different from the material of the semiconducting substrate, removing the first patterned mask layer, forming a second patterned mask layer above the substrate, wherein the second patterned mask layer covers the first region of the substrate and exposes a second region of the substrate where a second FinFET device will be formed, and performing at least one process operation through the second patterned mask layer to form a second fin for the first FinFET device, wherein the second fin is comprised of a second semiconductor material that is different from the material of the semiconducting substrate and different from the first semiconducting material.

Also disclosed is an integrated circuit product that is comprised of a first FinFET device formed in and above a semiconducting substrate, wherein the first FinFET device comprises a first fin that is comprised of a first semiconductor material that is different from the material of the semiconducting substrate, and a second FinFET device formed in and above the semiconducting substrate, wherein the second FinFET device comprises a second fin that is comprised of a second semiconductor material that is different from the material of the semiconducting substrate and different from the first semiconductor material.

BRIEF DESCRIPTION OF THE DRAWINGS

The disclosure may be understood by reference to the following description taken in conjunction with the accompanying drawings, in which like reference numerals identify like elements, and in which:

FIGS. 3A-3I depict one illustrative method of forming the fin structures on the novel devices disclosed herein.

Figure 1:
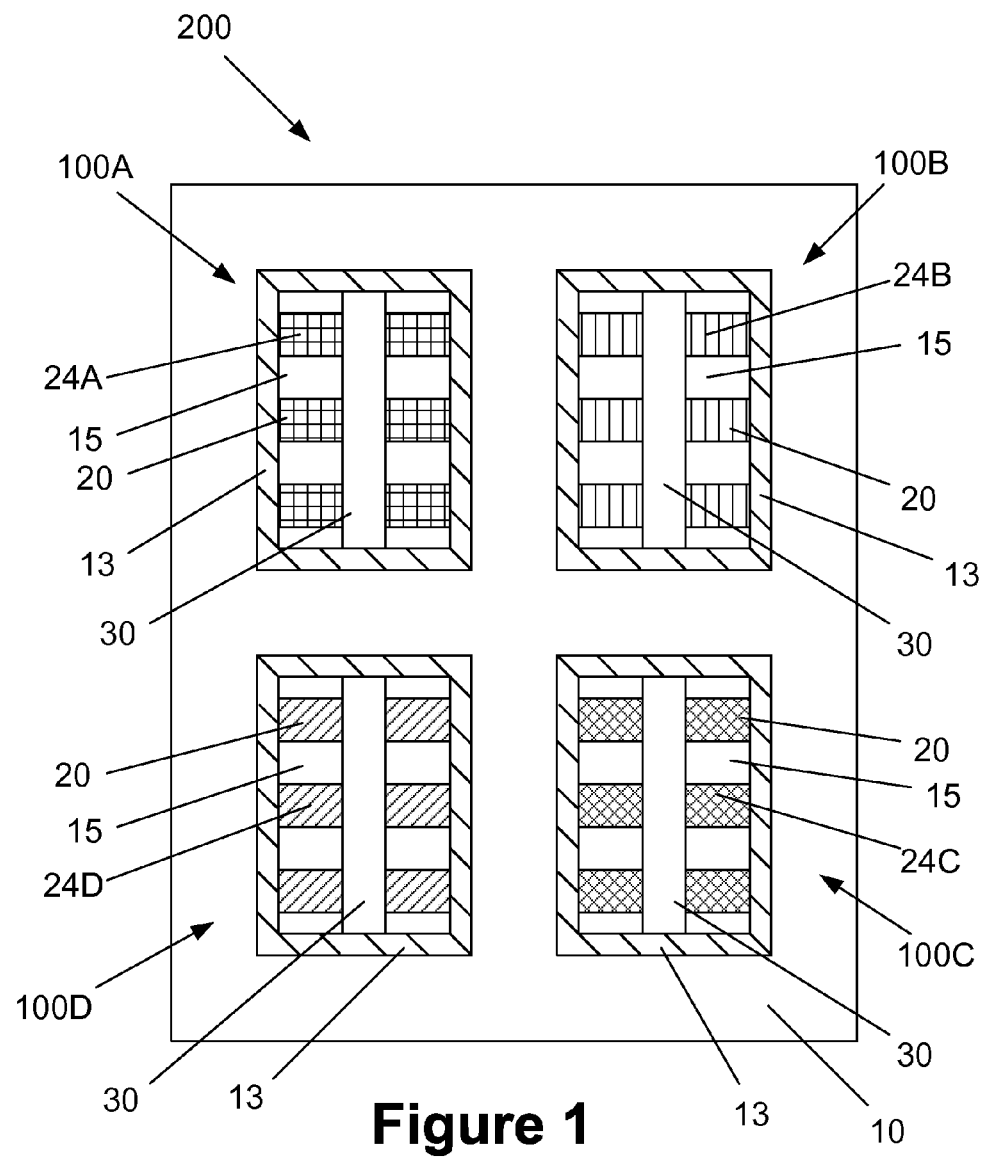
FIG. 1 depicts one illustrative embodiment of a product disclosed herein wherein the different FinFET devices in the product have different threshold voltages due to the use of different materials of construction for the fins of such devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming different FinFET devices with different threshold voltages by varying the materials of construction for the fins of such devices, and to integrated circuit products that contain such FinFET devices. As will be readily apparent to those skilled in the art upon a complete reading of the present application, the present method is applicable to a variety of devices, including, but not limited to, logic devices, memory devices, etc. Moreover, the techniques disclosed herein may be employed to form N-type and/or P-type FinFET devices. With reference to the attached figures, various illustrative embodiments of the methods and devices disclosed herein will now be described in more detail.

FIG. 1 is a simplified plan view of an illustrative integrated circuit product 200 comprised of a plurality of schematically depicted FinFET devices 100A-100D. Each of the illustrative FinFET semiconductor devices 100A-D are depicted at an intermediate stage of manufacturing. The devices 100A-D are formed in and above an illustrative semiconducting substrate 10. The substrate 10 may have a variety of configurations, such as the depicted bulk silicon configuration. The substrate 10 may be made of materials other than silicon. The substrate 10 may also have a silicon-on-insulator (SOI) configuration that includes a bulk silicon layer, a buried insulation layer and an active layer, wherein FinFET devices 100A-D are formed in and above the active layer. Thus, the terms "substrate" or "semiconducting substrate" should be understood to cover all forms of semiconductor structures. Of course, as will be recognized by those skilled in the art, the number of such devices 100A-D that are included in any particular product may vary depending upon the particular application, e.g., a single integrated circuit product may contain hundreds or thousands of such devices. The four illustrative devices 100A-D may be formed on a single die, or each may be formed on separate die that are formed on a wafer comprised of a semiconducting material.

At the point of fabrication depicted in FIG. 1, a plurality of isolation structures 13, e.g., shallow trench isolation structures, have been formed in the substrate 10 using well-known techniques to define active regions in the substrate 10 where the devices 100A-D are formed. Each of the devices 100A-D is comprised of a plurality of fins 20 separated by illustrative local isolation regions 15 and a schematically depicted gate structure 30. In the example depicted herein, each of the devices 100A-D has three illustrative fins 20. Of course, the number of fins 20 on each of the devices 100A-D may vary and each of the devices 100A-D need not have the same number of fins. Additionally, the fins 20 on each of the devices 100A-D need not have the same fin width and/or fin height.

With continuing reference to FIG. 1, the devices 100A-D are each comprised of fins 20 having different materials of construction which results in each of the devices 100A-D having different threshold voltages. More specifically, the fins 20 for the devices 100A, 100B, 100C and 100D are comprised of different semiconductor materials 24A, 24B, 24C and 24D, respectively, as reflected by the different cross-hatching of the fins 20 for each of the devices 100A-D. In one illustrative embodiment, the semiconductor materials 24A-D may be semiconductor material that has binary, tertiary or quaternary compounds. Examples of such semiconductor materials 24A-D include, but are not limited to: (1) $Si_{1-x}Ge_x$ (where "x" ranges from 0-1); (2) III-V compound semiconductor materials such as $In_{1-x}Ga_xAs$; $In_{1-x}Ga_xSb$ (where "x" ranges from 0-1); (3) II-VI compound semiconductor materials; (4) silicon-carbon, or combinations thereof, and the semiconductor materials 24A-D may be either doped (in situ) or un-doped. In one illustrative embodiment, the semiconductor materials 24A-D may be formed by performing well-known epitaxial deposition processes using the appropriate precursor gases. As will be appreciated by those skilled in the art after a complete reading of the present application, at the point of fabrication depicted in FIG. 1, traditional manufacturing operations may be performed on the devices 100A-D to complete their manufacture, e.g., source/drain regions and various conductive contacts may be formed for the devices 100A-D.

Figure 2A:
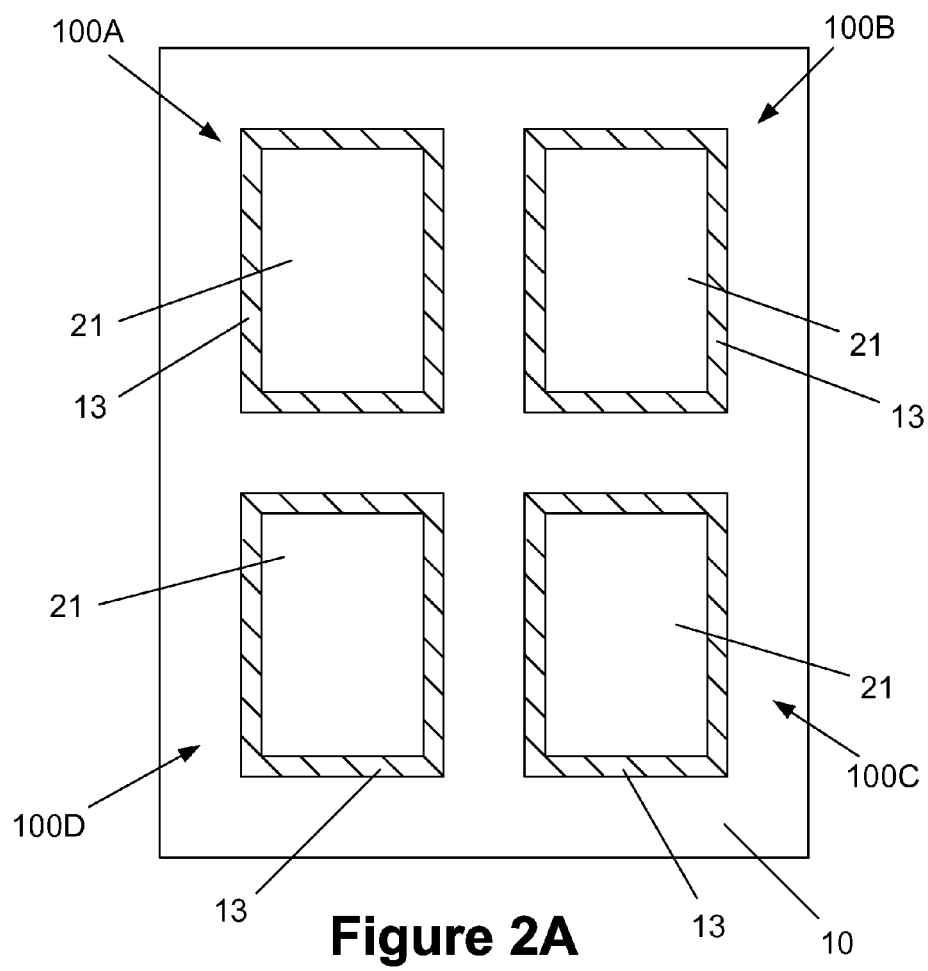
FIGS. 2A-2F depict one illustrative process flow for forming the novel devices disclosed herein.

FIGS. 2A-2F depict one illustrative process flow that may be employed to form an integrated circuit product wherein different FinFET devices have fins with different material compositions. Initially, as shown in FIG. 2A, the isolation regions 13 are formed in the substrate 10 using traditional techniques to thereby define active regions 21 wherein the various devices 100A-D will be formed. As noted above, although the active regions 21 are depicted as being the same physical size in the attached drawings, the active regions 21 may vary in size and configuration depending upon the particular device to be formed in a particular active region.

Figure 2B:
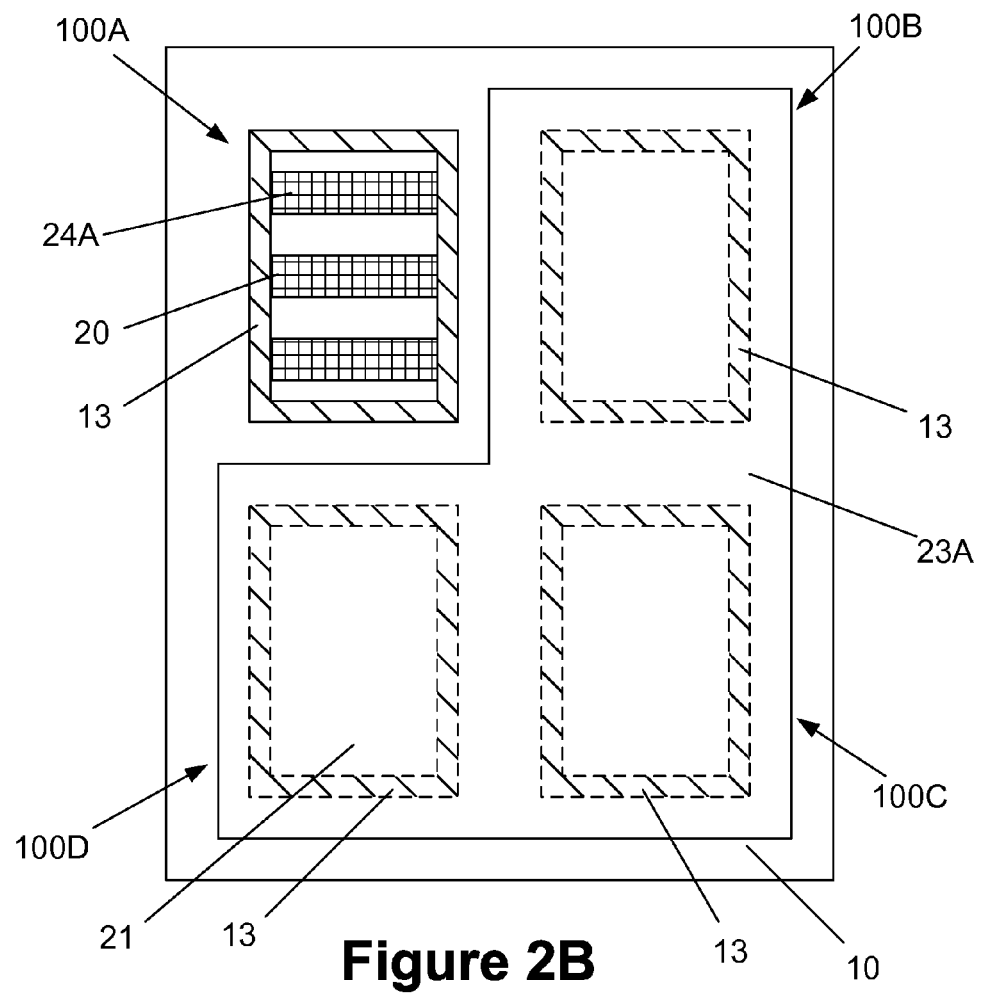

As shown in FIG. 2B, a first patterned mask layer 23A, such as a patterned hard mask layer, is initially formed above the substrate 10. The first patterned mask layer 23A exposes the active region 21 where the device 100A will be formed while covering the active regions where the devices 100B-D will be formed. The first patterned mask layer 23A is intended to be representative in nature as it could be comprised of a variety of materials, such as, for example, a photoresist material, silicon nitride, silicon oxynitride, silicon dioxide, etc. Moreover, the first patterned mask layer 23A could be comprised of multiple layers of material, such as, for example, a pad oxide layer (not shown) that is formed on the substrate 10 and a silicon nitride layer (not shown) that is formed on the pad oxide layer. Thus, the particular form and composition of the first patterned mask layer 23A and the manner in which it is made should not be considered a limitation of the present invention. In the case where the first patterned mask layer 23A is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In some embodiments, the first patterned mask layer 23A may be patterned using traditional photolithography and etching processes. After the first patterned mask layer 23A is formed, various process operations (including the ones described more fully below) are performed to form the fins 20, comprised of the first semiconductor material 24A, for the device 100A. In the illustrative process flow described in FIGS. 2A-2F, the gate structures for the devices 100A-D are not formed until after the fins 20 for all of the devices 100A-D have been formed. However, if desired, the gate structure 30 (not shown in FIG. 2B) could be formed on the device 100A at this point in the process flow. Thus, the methods disclosed herein also allow for the formation of different gate structure materials for each of the devices 100A-D if desired.

Figure 2C:
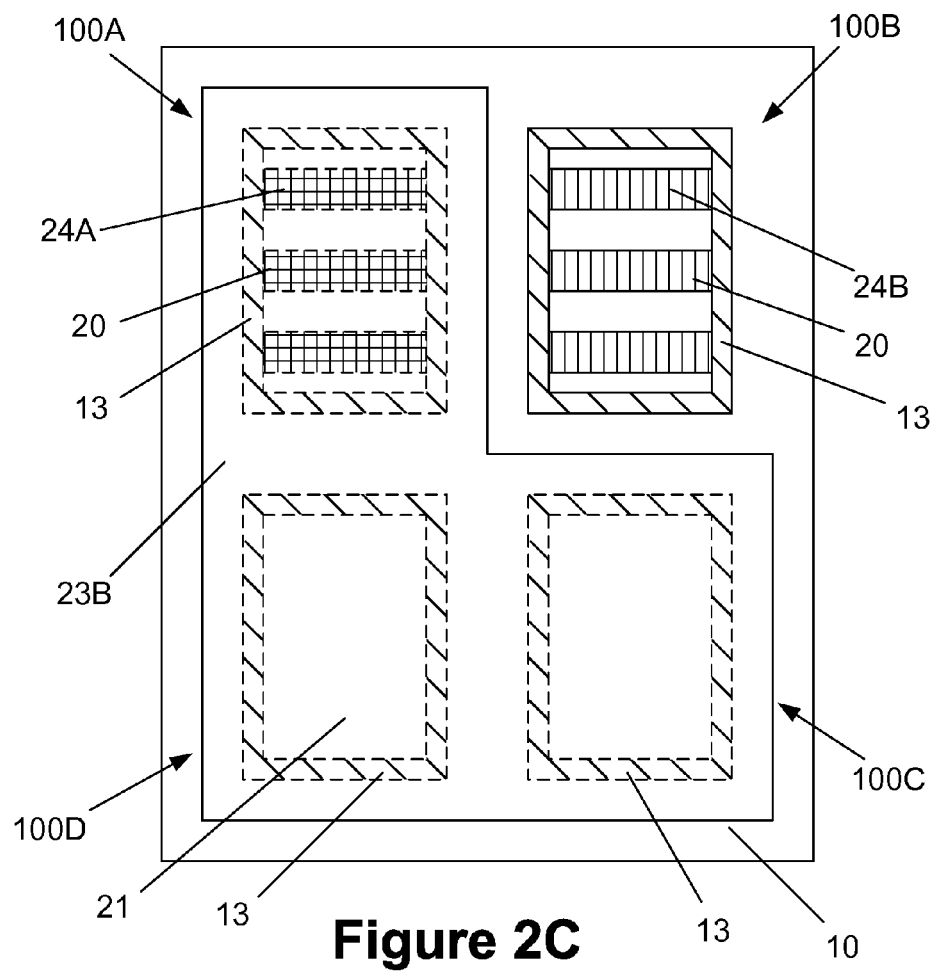

Next, as shown in FIG. 2C, the first patterned mask layer 23A has been removed and a second patterned mask layer 23B has been formed above the substrate 10. The second patterned mask layer 23B may be formed of the same materials and using the same techniques as those described above for forming the first mask layer 23A. The second patterned mask layer 23B exposes the active region 21 where the device 100B will be formed while covering the active regions where the devices 100A and 100C-D will be formed. After the second patterned mask layer 23B is formed, various process operations (including the ones described more fully below) are performed to form the fins 20, comprised of the second semiconductor material 24B, for the device 100B.

Figure 2D:
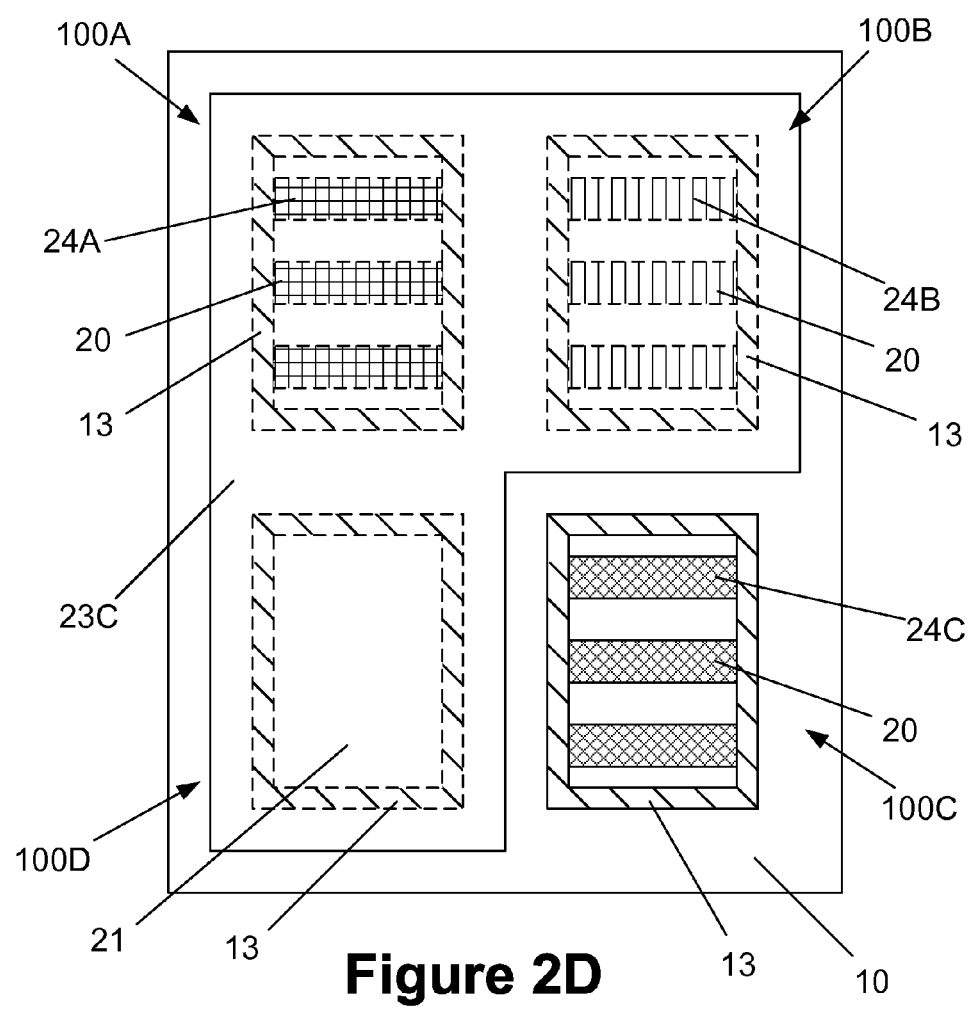

Next, as shown in FIG. 2D, the second patterned mask layer 23B has been removed and a third patterned mask layer 23C has been formed above the substrate 10. The third patterned mask layer 23C may be formed of the same materials and using the same techniques as those described above for the first patterned mask layer 23A. The third patterned mask layer 23C exposes the active region 21 where the device 100C will be formed while covering the active regions where the devices 100A-B and 100D will be formed. After the third patterned mask layer 23C is formed, various process operations (including the ones described more fully below) are performed to form the fins 20, comprised of the third semiconductor material 24C, for the device 100C.

Figure 2E:
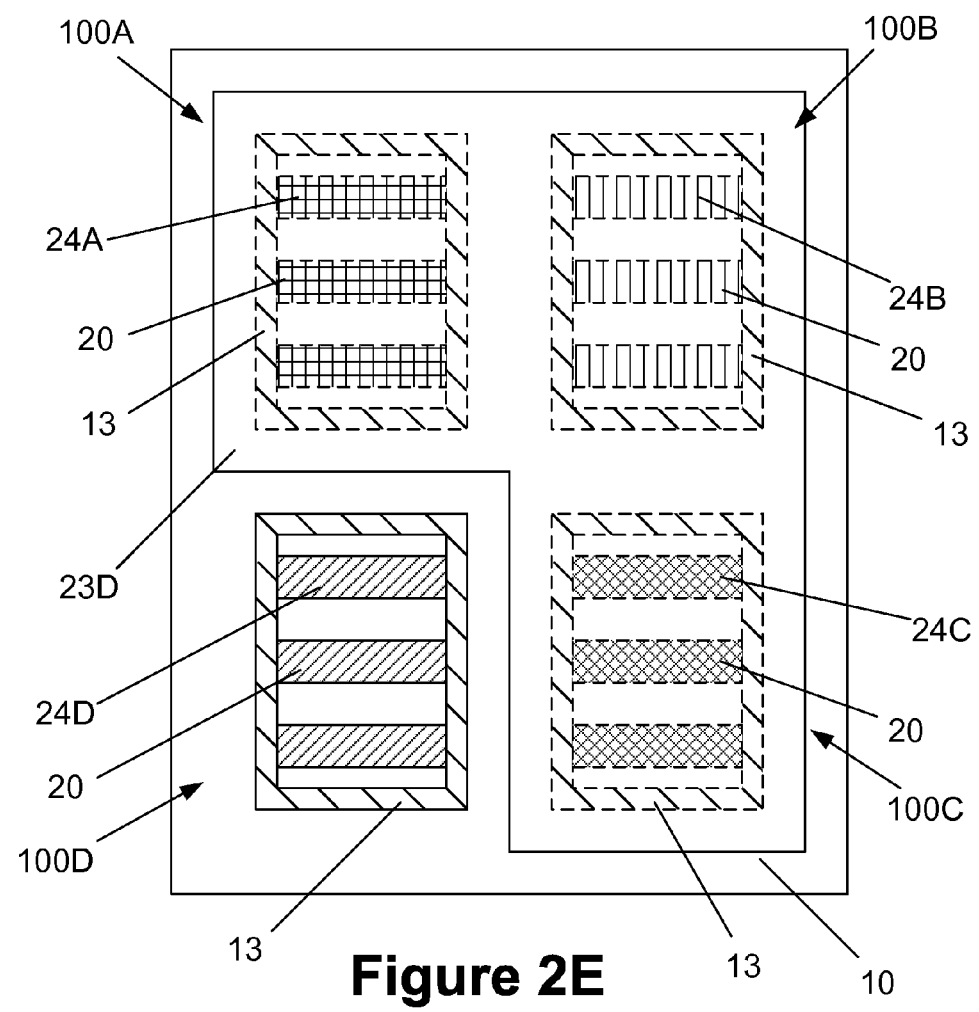

Next, as shown in FIG. 2E, the third patterned mask layer 23C has been removed and a fourth patterned mask layer 23D has been formed above the substrate 10. The fourth patterned mask layer 23D may be formed of the same materials and using the same techniques as those described above for the first patterned mask layer 23A. The fourth patterned mask layer 23D exposes the active region 21 where the device 100D will be formed while covering the active regions where the devices 100A-C will be formed. After the fourth patterned mask layer 23D is formed, various process operations (including the ones described more fully below) are performed to form the fins 20, comprised of the fourth semiconductor material 24D, for the device 100D.

Figure 2F:
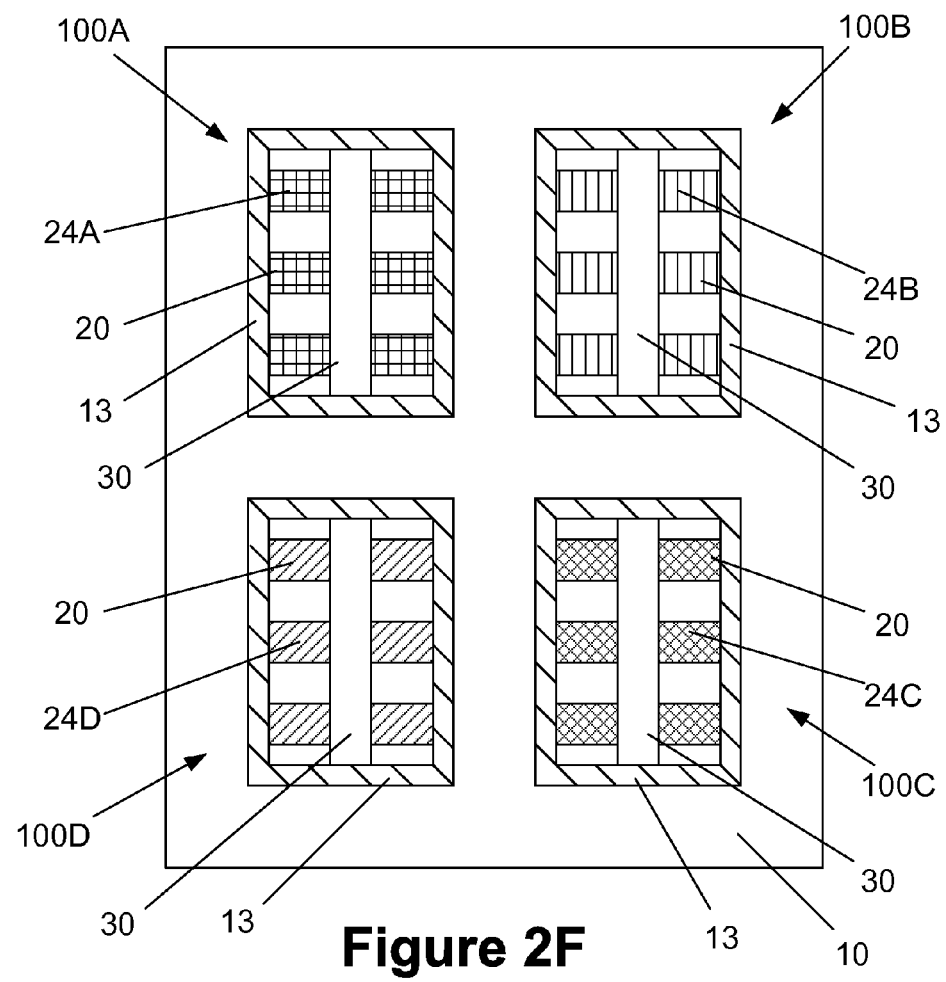

Next, as shown in FIG. 2F, the fourth hard mask layer 23D has been removed and various process operations, including the illustrative ones described below, may be performed to form identical gate structures 30 on each of the devices 100A-D. As will be appreciated by those skilled in the art after a complete reading of the present application, at the point of fabrication depicted in FIG. 2F, traditional manufacturing operations may be performed on the devices 100A-D to complete their manufacture, e.g., source/drain regions and various conductive contacts may be formed for the devices 100A-D.

Various techniques may be employed to form the different semiconductor materials 24A-D on the various devices 100A-D. Thus, the particular manner in which such semiconductor materials are formed should not be considered to be a limitation of the present invention unless such limitations are expressly and unambiguously set forth in the attached claims. FIGS. 3A-3I depict one illustrative method that may be employed to form the different semiconductor materials 24A-D, wherein the generic number "24" will be employed to describe any of the semiconductor materials 24A-D and the generic number "100" will be employed to describe any of the illustrative devices 100A-D.

Figure 3A:
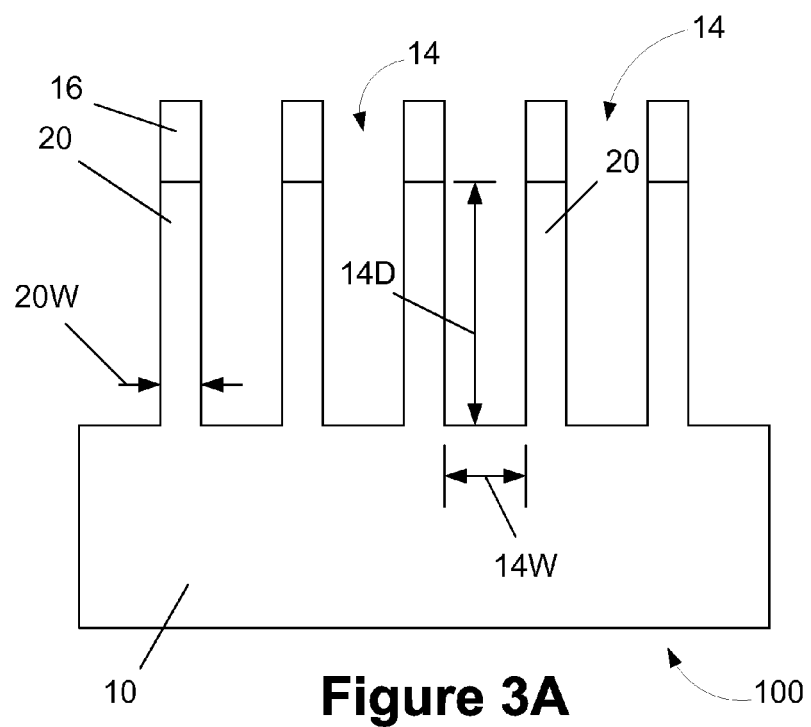

FIG. 3A is a simplified view of an illustrative FinFET semiconductor device 100 at the point of fabrication wherein a patterned mask layer 16, such as a patterned hard mask layer, has been formed above the substrate 10 using known photolithography and etching techniques. Thereafter, an etching process, such as a dry or wet etching process, is then performed on the substrate 10 through the patterned mask layer 16 to form a plurality of trenches 14. This etching process results in the definition of a plurality of fins 20. As discussed more fully below, the fins 20 depicted in FIG. 3A will actually be a first portion of the final fin structure for the device 100. In some applications, a further etching process may be performed to reduce the width or to "thin" the fins 20, although such a thinning process is not depicted in the attached drawings. For purposes of this disclosure and the claims, the use of the terms "fin" or "fins" should be understood to refer to fins that have not been thinned as well as fins that have been subjected to such a thinning etch process. The overall size, shape and configuration of the trenches 14 and fins 20 may vary depending on the particular application. The depth 14D and width 14W of the trenches 14 may vary depending upon the particular application. In one illustrative embodiment, based on current day technology, the depth 14D of the trenches 14 may range from approximately 30-150 nm and the width 14W of the trenches 14 may range from about 20-50 nm. In some embodiments, the fins 20 may have a final width 20W within the range of about 5-30 nm. In the illustrative example depicted in FIGS. 3A-3I, the trenches 14 and fins 20 are all of a uniform size and shape. However, as discussed more fully below, such uniformity in the size and shape of the trenches 14 and the fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14, and the manner in which they are made, should not be considered a limitation of the present invention. For ease of disclosure, only the substantially rectangular trenches 14 will be depicted in subsequent drawings.

Figure 3B:
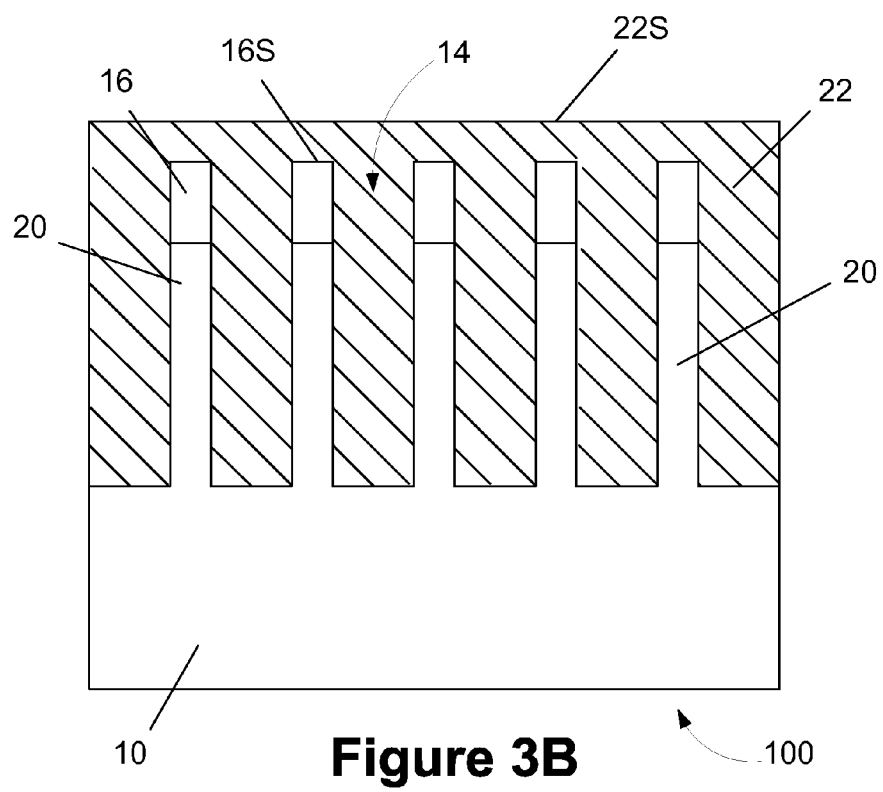

Then, as shown in FIG. 3B, a layer of insulating material 22 is formed in the trenches 14 of the device. The layer of insulating material 22 may be comprised of a variety of different materials, such as silicon dioxide, etc., and it may be formed by performing a variety of techniques, e.g., CVD, spin-coating, etc. In one illustrative embodiment, the layer of insulating material 22 may be a flowable oxide material that is formed by performing a CVD process. Such a flowable oxide material is adapted for use with fins 20 of different configurations, even fins 20 with a reentrant profile. In the example depicted in FIG. 3B, the surface 22S of the layer of insulating material 22 is the "as-deposited" surface of the layer 22. In this example, the surface 22S of the layer of insulating material 22 may be positioned slightly above the upper surface 16S of the mask layer 16. Portions of the insulating material 22 will eventually become the local isolation regions 15 (see FIG. 1) between the fins 20. Given the natures of the illustrative process flow described above in FIGS. 2A-2F, if desired, different insulating materials 22 may be employed on each of the different devices 100A-D.

Figure 3C:
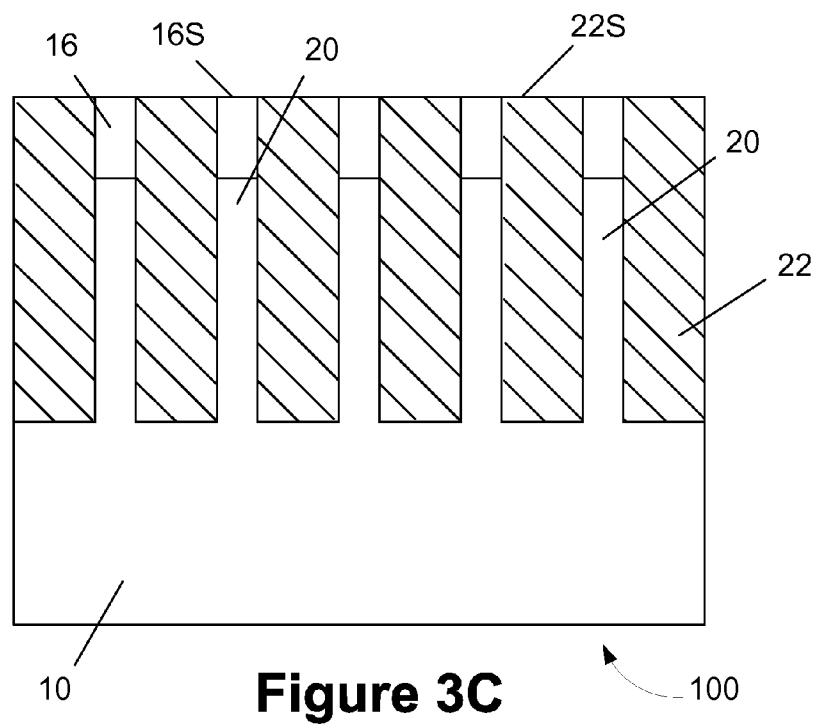

Next, as shown in FIG. 3C, one or more chemical mechanical polishing (CMP) processes may be performed to planarize the surface 22S using the mask layer 16 as a polish stop layer. After such a CMP process, the surface 22S of the layer of insulating material 22 is substantially level with the surface 16S of the mask layer 16. However, as will be appreciated by those skilled in the art, in some cases, the mask layer 16 may be removed prior to forming the layer of insulating material 22. In such an application, the CMP process would stop on the surface of the fins.

Figure 3D:
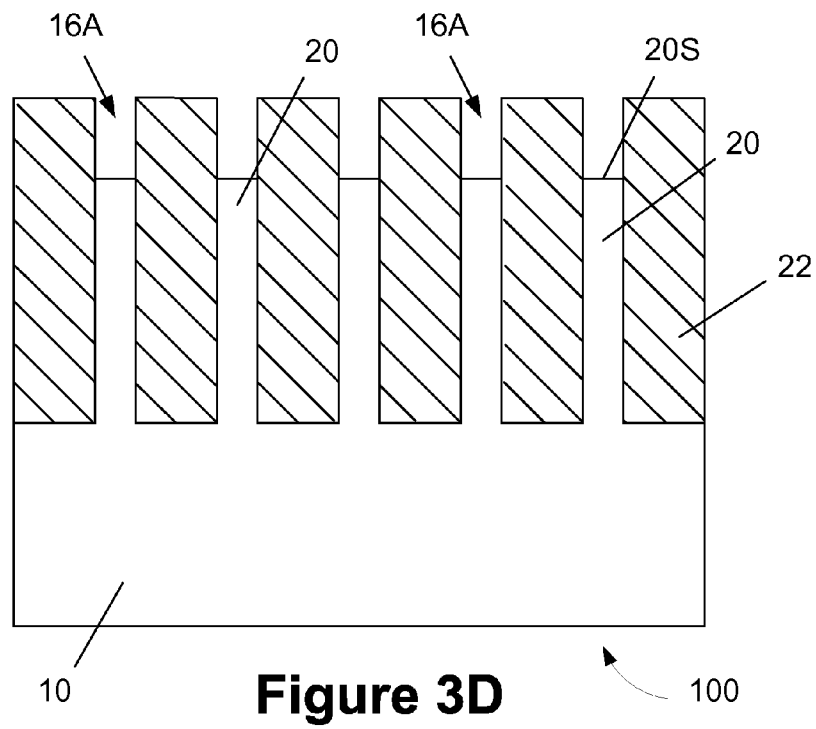

Next, as shown in FIG. 3D, an etching process is performed to remove the patterned hard mask layer 16. The etching process results in the definition of cavities 16A that expose an upper surface 20S of the fins 20.

Figure 3E:
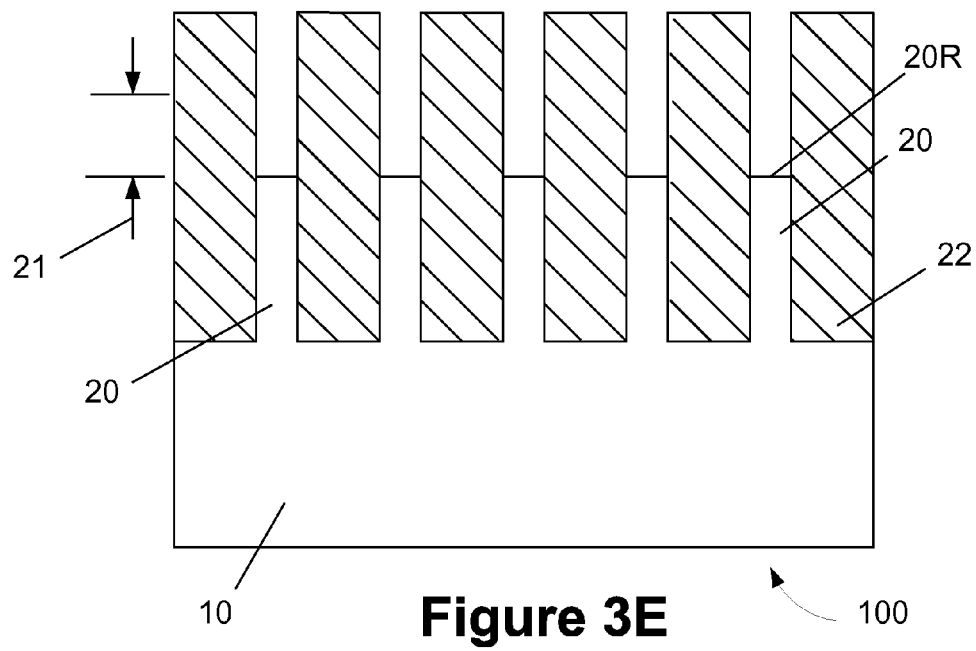

Then, as shown in FIG. 3E, an etching process is performed to recess the fins 20 by a distance 21. The etching process results in the fins 20 having a recessed surface 20R. The magnitude of the distance 21 may vary depending on the particular application. In one illustrative embodiment, the distance 21 may fall within the range of about 10-40 nm.

Figure 3F:
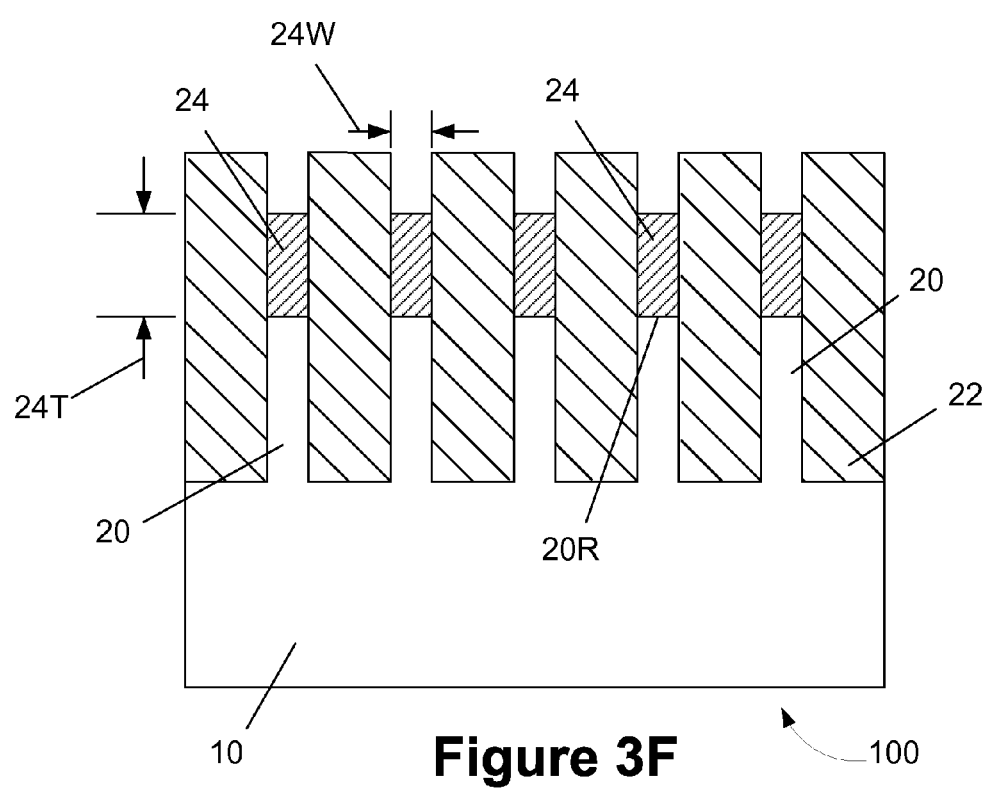

Next, as shown in FIG. 3F, an alternative semiconductor fin material 24 is formed on the fins 20. In one illustrative embodiment, this alternative semiconductor material 24 is actually a second portion of the final fin structure for the device 100, with the first portion of the fin being the fin 20 that is defined by etching the substrate 10. In one illustrative embodiment, an epitaxial deposition process is performed to form the alternative fin material 24. The height 24T of the alternative fin material 24 may vary depending upon the particular application, e.g., it may vary from about 10-40 nm. The alternative fin material 24 also has a width 24W that corresponds to the final width of the fins for the device 100. The alternative fin material 24 may be comprised of a variety of different materials, such as those described above, and it may be either doped (in situ) or un-doped.

Figure 3G:
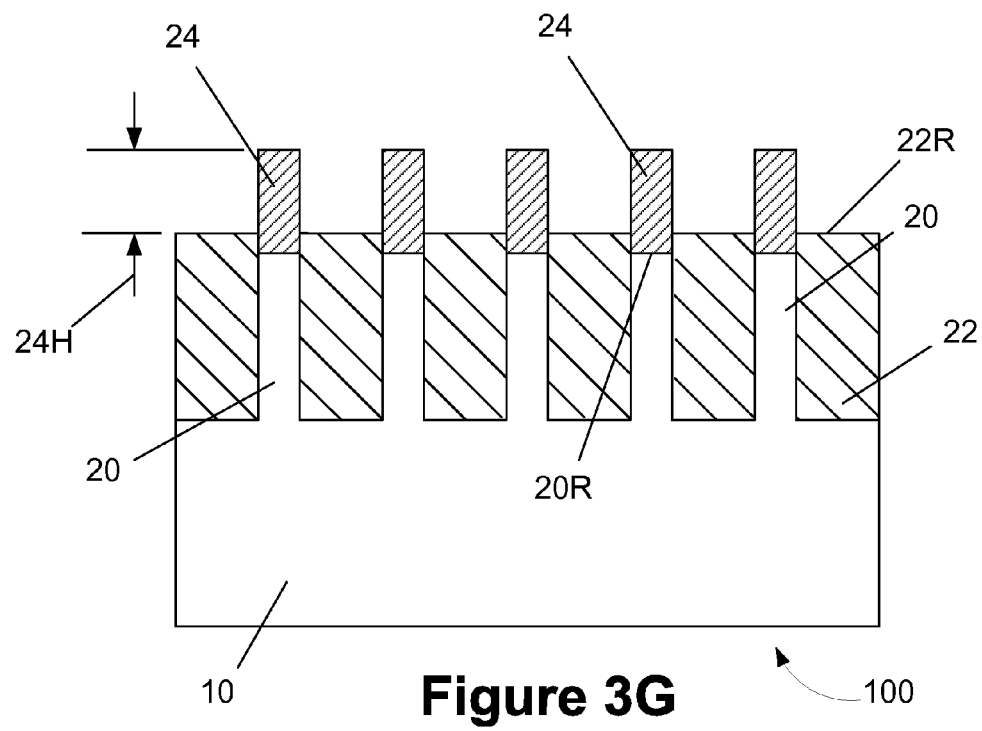

FIG. 3G depicts the device 100 after an etching process has been performed on the layer of insulating material 22 to reduce its thickness and thereby result in the layer of insulating material having a recessed surface 22R. This recessed layer of insulating material 22 actually corresponds to the local isolation regions 15 shown in FIG. 1. The recessed surface 22R of the layer of insulating material 22 essentially defines the final fin height 24H of the fins 20. The fin height 24H may vary depending upon the particular application and, in one illustrative embodiment, may range from about 5-50 nm. In one illustrative example, the recessed surface 22R of the layer of insulating material 22 is positioned above the recessed surface 20R of the fins 20, i.e., the recessing of the layer of insulating material 22 is controlled such that only the alternative fin material 24 is exposed above the recessed surface 22R of the layer of insulating material 22. In other applications, the layer of insulating material 22 may be recessed by an amount such that the entirety of the alternative fin material 24 and a portion of the underlying fin 20 are positioned above the recessed surface 22R of the layer of insulating material 22.

Figure 3H:
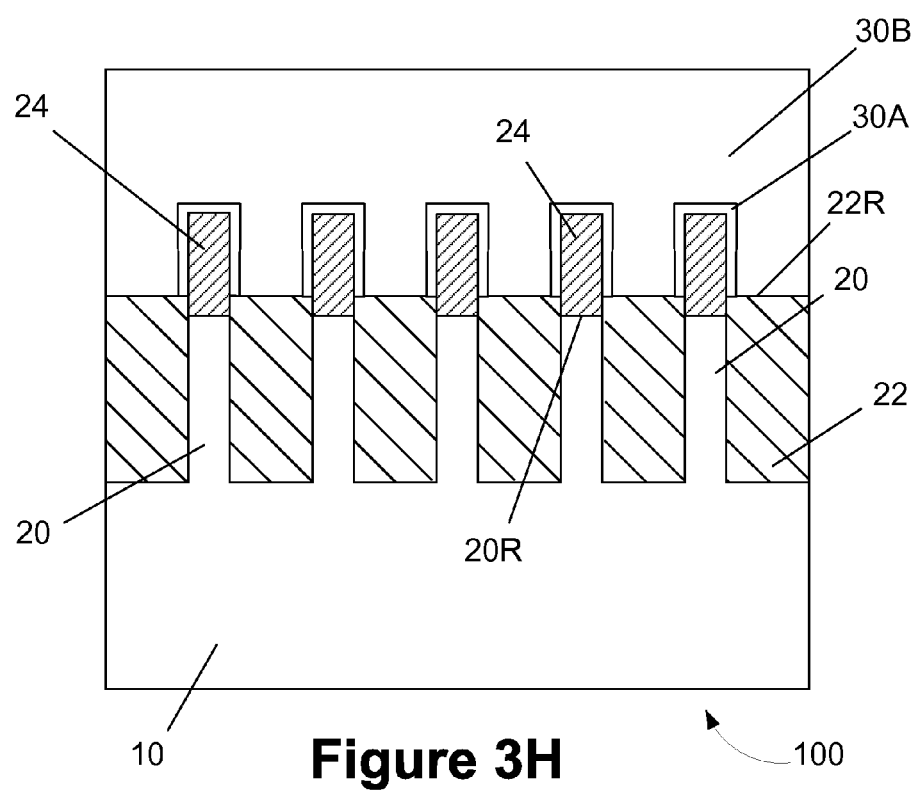

At the point of processing depicted in FIG. 3G, the illustrative FinFET device 100 may be completed using traditional fabrication techniques. For example, FIG. 3H depicts the device 100 after an illustrative gate structure has been formed for the device 100. In one illustrative embodiment, the schematically depicted gate structure includes an illustrative gate insulation layer 30A and an illustrative gate electrode 30B. The gate insulation layer 30A may be comprised of a variety of different materials, such as, for example, silicon dioxide, a so-called high-k (k greater than 5) insulation material (where k is the relative dielectric constant), etc. Similarly, the gate electrode 30B may also be of a material such as polysilicon or amorphous silicon, or it may be comprised of one or more metal layers that act as the gate electrode 30B. As will be recognized by those skilled in the art after a complete reading of the present application, the gate structure of the device 100 depicted in the drawings, i.e., the gate insulation layer 30A and the gate electrode 30B, is intended to be representative in nature. That is, the gate structure may be comprised of a variety of different materials and it may have a variety of configurations, and the gate structure may be made using either the so-called "gate first" or "replacement gate" techniques. In one illustrative embodiment, as shown in FIG. 3H, an oxidation process or a conformal deposition process may be performed to form a gate insulation layer 30A comprised of a material such as, for example, silicon dioxide, silicon nitride, hafnium oxide, a high-k (k value greater than 10) insulating material, etc., on the fins 20. Thereafter, the gate electrode material 30B and a gate capping layer of material (not shown) may be deposited above the device 100 and the layers may be patterned using known photolithographic and etching techniques and planarized by known CMP techniques. Thereafter, using traditional techniques, sidewall spacers (not shown) may be formed proximate the gate structure by blanket depositing a layer of spacer material and thereafter performing an anisotropic etching process to define the spacers.

In an alternative process flow, the etching step that is performed to recess the fins 20, as depicted in FIG. 3E, may be omitted. FIG. 3I depicts the device 100 at a point in fabrication that corresponds to that shown in FIG. 3D. However, as shown in FIG. 3I, the alternative fin material 24 is formed on the exposed upper surfaces 20S of the fins 20.

In another illustrative example, the various semiconductor materials 24A-D may be formed above the substrate 10 prior to performing the trenches that will define the basic fin structure for the devices 100A-D. For example, with the first patterned mask layer in place, an epitaxial deposition process may be performed to form the semiconductor material 24A on the exposed portions of the substrate 10. Thereafter, traditional techniques may be employed to define the fins 20: form a pad oxide layer on the semiconductor material 24A; form a pad nitride layer on the pad oxide layer; pattern the pad nitride/pad oxide layers to define a multi-layer, patterned hard mask layer; perform at least one etching process through the patterned hard mask layer to etch through the semiconductor material 24A and into the substrate 10 (although etching into the substrate 10 may not be required in all applications) to define a plurality of trenches and corresponding fins 20 for the device 100A; deposit a layer of insulating material in the trenches; perform a CMP process to planarize the layer of insulating material with the hard mask layer; perform an etching process to reduce the thickness of the layer of insulating material and thereby define the final height of the fins; form a gate structure for the device, etc. The first patterned mask layer 23A may then be removed, the second patterned mask layer 24B may then be formed and the process steps may be repeated to form at least the fins 20 comprised of the second semiconductor material 24B.

Using the illustrative techniques disclosed herein, FinFET semiconductor devices with different threshold voltages may be formed by fabricating the fins for such devices with different semiconductor materials. For example, a first device 100A may have fins 20 comprised of silicon germanium, while a second device 100B may have fins 20 comprised of a III-V material. In another example, the first device 100A may have fins 20 comprised of silicon-germanium, while the second device 100B may have fins 20 comprised of silicon-carbon. In yet another example, the first device 100A may have fins 20 comprised of silicon-germanium with a germanium concentration of about 30%, while a second device 100B may have fins 20 comprised of silicon-germanium with a germanium concentration of about 10%. Such FinFET devices with different threshold voltages will give circuit designers greater flexibility in meeting the ever-increasing demand for increasingly complex circuitry to be fabricated on a single substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming first and second FinFET devices in and above a semiconducting substrate, comprising:

forming a first patterned mask layer above said substrate that exposes a first region of said substrate where said first FinFET device will be formed and masks a second region of said substrate where said second FinFET device will be formed;

with said first patterned mask layer in position, forming a first fin for said first FinFET device, wherein said first fin is comprised of a first semiconductor material that is different from the material of said semiconducting substrate;

removing said first patterned masking layer;

after removing said first patterned masking layer, forming a second patterned masking layer that masks said first region of said substrate and exposes said second region of said substrate where said second FinFET device will be formed; and after forming said first fin, and with said second patterned masking layer in position, forming a second fin for said second FinFET device, wherein said second fin is comprised of a second semiconductor material that is (a) in contact with said material of said semiconducting substrate, (b) different from the material of said semiconducting substrate and (c) different from said first semiconductor material.

2. The method of claim 1, wherein forming said first fin comprises forming said first fin from one of a $Si_{1-x}Ge_x$ material (where "x" ranges from 0-1), a III-V compound semiconductor material, a II-VI compound semiconductor material, or silicon-carbon or combinations thereof.

3. The method of claim 2, wherein forming said second fin comprises forming said second fin from one of a $Si_{1-x}Ge_x$ material (where "x" ranges from 0-1), a III-V compound semiconductor material, a II-VI compound semiconductor material, or silicon-carbon or combinations thereof.

4. The method of claim 3, wherein said semiconducting substrate is comprised of silicon.

5. The method of claim 1, wherein forming said first fin comprises performing a first epitaxial deposition process to form said first semiconductor material.

6. The method of claim 5, wherein forming said second fin comprises performing a second epitaxial deposition process to form said second semiconductor material.

7. A method of forming first and second FinFET devices in and above a semiconducting substrate, comprising:
forming a first patterned mask layer above said substrate, said first patterned mask layer exposing a first region of said substrate where said first FinFET device will be formed;

with said first patterned mask layer in position, performing at least one process operation through said first patterned mask layer to form a first fin for said first FinFET device, wherein said first fin is comprised of a first semiconductor material that is in contact with and different from the material of said semiconducting substrate;

after forming said first fin, removing said first patterned mask layer;

forming a second patterned mask layer above said substrate, said second patterned mask layer covering said first region of said substrate and exposing a second region of said substrate where said second FinFET device will be formed; and with said second patterned mask layer in position, performing at least one process operation through said second patterned mask layer to form a second fin for said second FinFET device, wherein said second fin is comprised of a second semiconductor material that is (a) in contact with and different from the material of said semiconducting substrate and (b) different from the material of said first semiconductor material.

8. The method of claim 7, wherein performing said at least one process operation through said first patterned mask layer to form said first fin comprises performing said at least one process operation through said first patterned mask layer to form said first fin from one of a $Si_{1-x}Ge_x$ material (where "x" ranges from 0-1), a III-V compound semiconductor material, a II-VI compound semiconductor material, or silicon-carbon or combinations thereof.

9. The method of claim 8, wherein performing said at least one process operation through said second patterned mask layer to form said second fin comprises performing said at least one process operation through said second patterned mask layer to form said second fin from one of a $Si_{1-x}Ge_x$ material (where "x" ranges from 0-1), a III-V compound semiconductor material, a II-VI compound semiconductor material, or silicon-carbon or combinations thereof.

10. The method of claim 9, wherein said semiconducting substrate is comprised of silicon.

11. The method of claim 7, wherein performing said at least one process operation through said first patterned mask layer to form said first fin comprises performing a first epitaxial deposition process to form said first semiconductor material.

12. The method of claim 11, wherein performing said at least one process operation through said second patterned mask layer to form said second fin comprises performing a second epitaxial deposition process to form said second semiconductor material.

13. The method of claim 1 wherein one or more of said first FinFET device and said second FinFET device comprise a plurality of fins.

14. The method of claim 7 wherein one or more of said first FinFET device and said second FinFET device comprise a plurality of fins.

* * * * *